(12) United States Patent
Su

(10) Patent No.: US 12,396,204 B2
(45) Date of Patent: Aug. 19, 2025

(54) FinFET WITH DISCONTINUOUS CHANNEL REGIONS

(71) Applicant: REALTEK SEMICONDUCTOR CORPORATION, Hsinchu (TW)

(72) Inventor: Hung-Der Su, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 387 days.

(21) Appl. No.: 17/954,606

(22) Filed: Sep. 28, 2022

(65) Prior Publication Data

US 2023/0116315 A1 Apr. 13, 2023

(30) Foreign Application Priority Data

Oct. 7, 2021 (TW) ................................ 110137356

(51) Int. Cl.
| | |
|---|---|
| H01L 29/78 | (2006.01) |
| H10D 30/62 | (2025.01) |
| H10D 62/17 | (2025.01) |
| H10D 64/00 | (2025.01) |

(52) U.S. Cl.
CPC ........... *H10D 30/62* (2025.01); *H10D 62/292* (2025.01); *H10D 64/118* (2025.01)

(58) Field of Classification Search
CPC .... H10D 30/62; H10D 62/292; H10D 64/118; H10D 30/6215; H10D 30/6217; H10D 62/149–161; H10D 30/668; H10D 12/031; H10D 30/0297; H10D 62/8325; H10D 62/393; H10D 62/127; H10D 62/107
See application file for complete search history.

(56) References Cited

U.S. PATENT DOCUMENTS

2017/0033113 A1* 2/2017 Zang ...................... H10B 12/03

OTHER PUBLICATIONS

Kim et al. "High-Voltage Drain-Extended FinFET With a High-k Dielectric Field Plate", Mar. 2020, IEEE Transactions on electron Devices, IEEE.

* cited by examiner

*Primary Examiner* — Cuong B Nguyen
(74) *Attorney, Agent, or Firm* — WPAT, PC

(57) ABSTRACT

A FinFET with discontinuous channel regions includes M gate-end structure(s), N drain-end structure(s), and a conducting structure. Each gate-end structure includes: a first channel structure including a source region and a first channel region; and a gate structure formed on a surface of the first channel region. Each drain-end structure includes: a second channel structure including a second channel region and a drain region, wherein the second channel region and the first channel region are discontinuous; and a reduced-surface-field structure formed on a surface of the second channel region. The conducting structure couples the first channel region of one of the M gate-end structure(s) with the second channel region of one of the N drain-end structure(s). The FinFET is characterized by a high withstand voltage and a low on-state resistance.

20 Claims, 7 Drawing Sheets

FinFET WITH DISCONTINUOUS CHANNEL REGIONS

BACKGROUND OF THE INVENTION

1. Field of the Invention

The present disclosure relates to a fin field-effect transistor (FinFET), especially to a FinFET with discontinuous channel regions.

2. Description of Related Art

The fin field-effect transistor (FinFET) technology is widely applied in a semiconductor process. A conventional FinFET has a single fin; although this FinFET can be used as a high voltage device, its optimization of the relation between an on-state resistance ($R_{ON}$) and a breakdown voltage ($V_{BD}$) of the FinFET is limited to the structure of the single fin, and thus it is difficult for the FinFET to achieve a low on-state resistance and a high breakdown voltage simultaneously.

SUMMARY OF THE INVENTION

An object of the present disclosure is to provide a fin field-effect transistor (FinFET) with discontinuous channel regions. The FinFET of the present disclosure can achieve a low on-state resistance and a high breakdown voltage simultaneously.

An embodiment of the FinFET of the present disclosure includes M gate-end structure(s), N drain-end structure(s), and a conducting structure, wherein both the M and the N are positive integers. Each of the M gate-end structure(s) includes a first channel structure and a gate structure. The first channel structure includes a source region and a first channel region, and thus the M gate-end structure(s) include(s) M first channel region(s). The gate structure is formed on a surface of the first channel region; accordingly, if the M is greater than one, M gate structures are formed on surfaces of M first channel regions respectively. Each of the N drain-end structure(s) includes a second channel structure and a reduced-surface-field (RESURF) structure. The second channel structure includes a second channel region and a drain region, and thus the N drain-end structure(s) include(s) N second channel region(s). The RESURF structure is formed on a surface of the second channel region; accordingly, if the N is greater than one, N RESURF structures are formed on surfaces of N second channel regions respectively. Any of the N second channel region(s) and any of the M first channel region(s) are discontinuous; in other words, the channel between the source and the drain of the FinFET is a discontinuous channel. The conducting structure is coupled with the first channel region of a certain gate-end structure of the M gate-end structure(s) and coupled with the second channel region of a certain drain-end structure of the N drain-end structure(s), and thereby the conducting structure couples the source and the drain of the FinFET together.

Another embodiment of the FinFET of the present disclosure includes M gate-end structure(s), N drain-end structure(s), and a conducting structure, wherein both the M and the N are positive integers and at least one of the M and the N is greater than one. On condition that the M is greater than one, the M gate-end structures are coupled together. On condition that the N is greater than one, the N drain-end structures are coupled together. Each of the M gate-end structure(s) includes a first channel structure and a gate structure. The first channel structure includes a source region and a first channel region, and thus the M gate-end structure(s) include(s) M first channel region(s). The gate structure is formed on a surface of the first channel region; accordingly, if the M is greater than one, M gate structures are formed on surfaces of M first channel regions respectively. Each of the N drain-end structure(s) includes a second channel structure. The second channel structure includes a second channel region and a drain region, and thus the N drain-end structure(s) include(s) N second channel region(s), wherein any of the N second channel region(s) and any of the M first channel region(s) are discontinuous. The conducting structure is coupled with the first channel region of one of the M gate-end structure(s) and coupled with the second channel region of at least one of the N drain-end structure(s).

These and other objectives of the present invention will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The specification discloses a fin field-effect transistor (FinFET) with discontinuous channel regions. This FinFET can achieve a low on-state resistance (a.k.a. on-resistance) and a high breakdown voltage (or a high withstand voltage) simultaneously.

Figure 1:
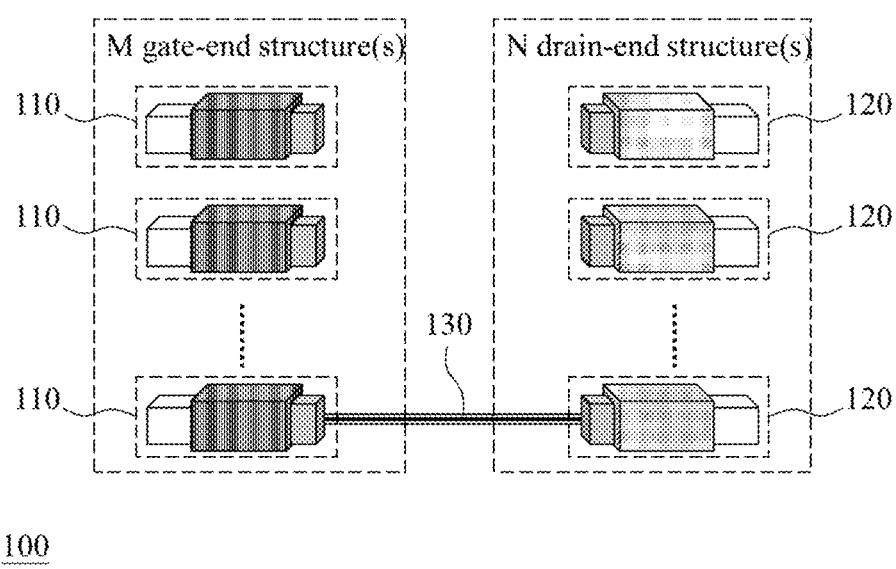
FIG. 1 shows an embodiment of the FinFET of the present disclosure.

FIG. 1 shows an embodiment of the FinFET of the present disclosure. The FinFET 100 of FIG. 1 includes M gate-end structure(s) 110, N drain-end structure(s) 120, and a conducting structure 130, wherein both the M and the N are positive integers. For example, at least one of the M and the N is greater than one; if the M is greater than one, the M gate-end structures 110 are coupled together; and if the N is greater than one, the N drain-end structures 120 are coupled together.

Figure 2:
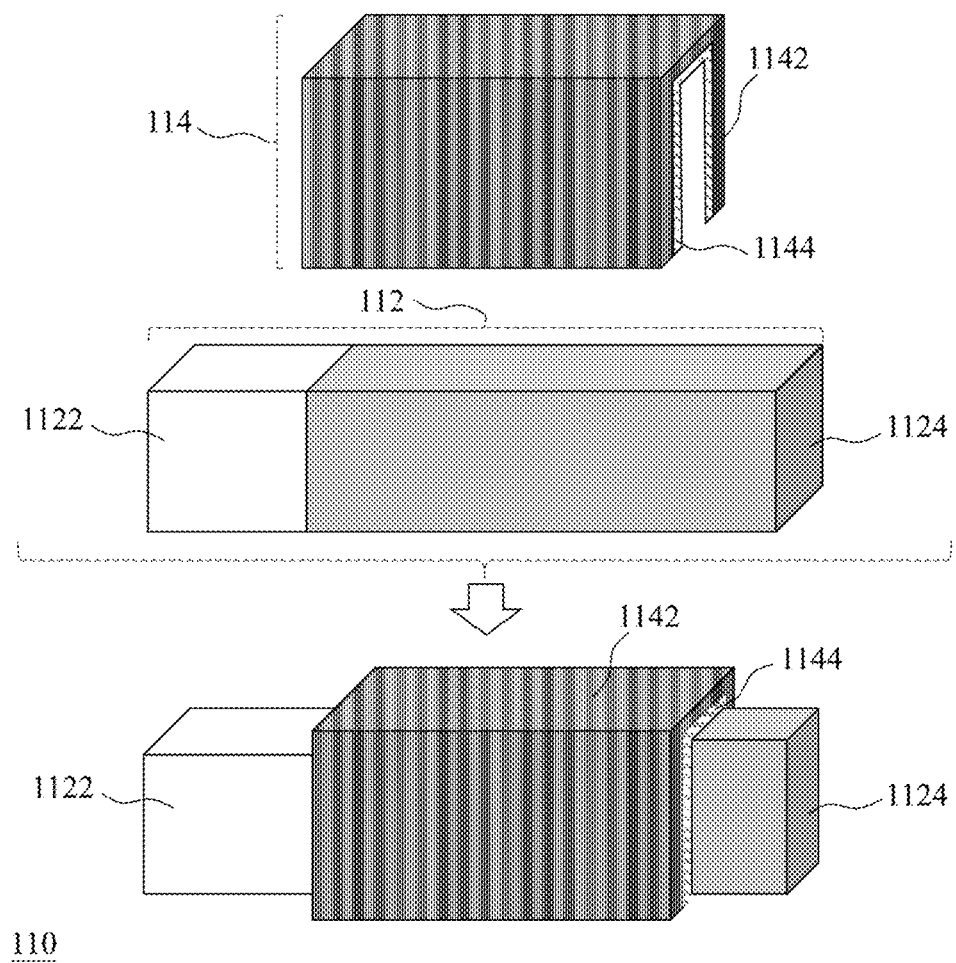
FIG. 2 shows an embodiment of each gate-end structure of FIG. 1.
Figure 3:
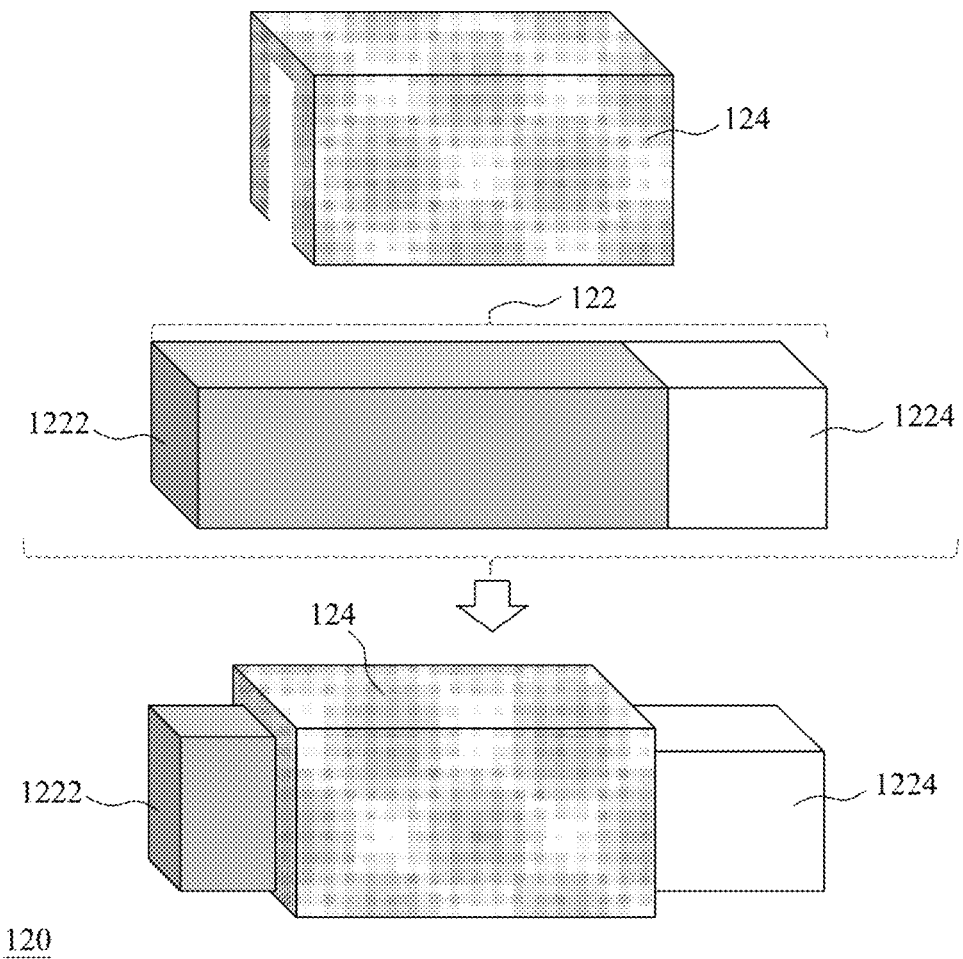
FIG. 3 shows an embodiment of each drain-end structure of FIG. 1.
Figure 4:
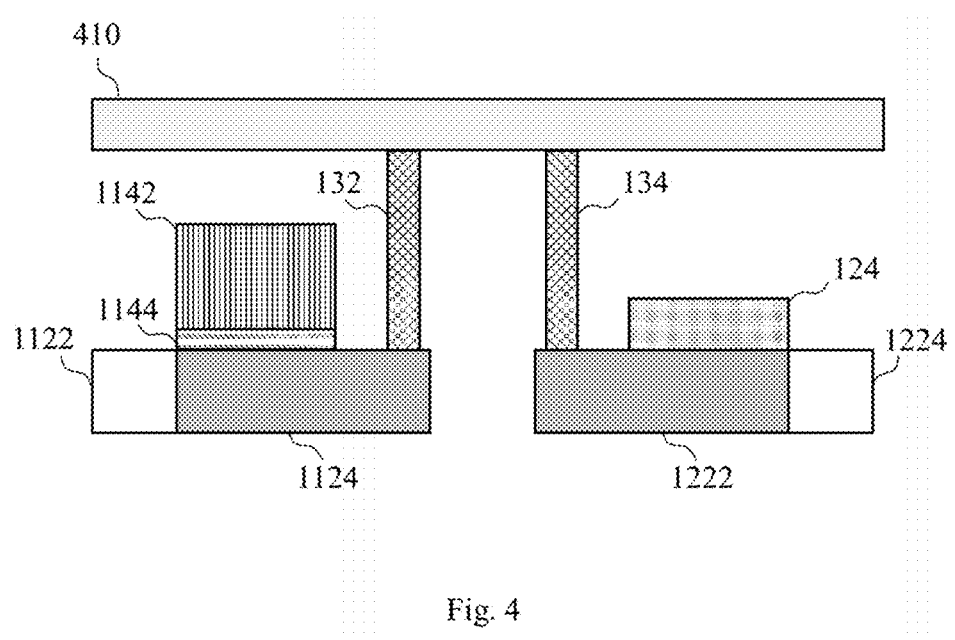
FIG. 4 is a cross-sectional view showing the conducting structure of FIG. 1 coupled with the gate-end structure and the drain-end structure.

FIG. 2 shows an embodiment of each gate-end structure 110 of FIG. 1, this embodiment including a first channel structure 112 and a gate structure 114. FIG. 3 shows an embodiment of each drain-end structure 120 of FIG. 1, this embodiment including a second channel structure 122 and a reduced-surface-field (RESURF) structure 124. FIG. 4 is a cross-sectional view showing an embodiment of the conducting structure 130 of FIG. 1 including a first contact 132 and a second contact 134; in this embodiment, the conducting structure 130 couples one of the M gate-end structure(s) 110 with one of the N drain-end structure(s) 120 through a conducting layer 410 (e.g., metal layer). It is noted that the length of each of the M gate-end structure(s) 110 is a first length, the length of each of the N drain-end structure(s) 120 is a second length, and the first length can be equal to the second length to simplify the process for manufacturing the FinFET 100; however, the present invention is not limited to the above features.

In regard to the embodiments of FIGS. 1 and 2, the first channel structure 112 of each gate-end structure 110 includes a source region 1122 and a first channel region 1124. The sizes, shapes, materials, doping concentration, and so on of the source region 1122 and the first channel region 1124 are dependent on the demand for implementation and beyond the scope of the present disclosure. The M gate-end structure(s) 110 include(s) M source region(s) 1122 and M first channel region(s) 1124. When the M is greater than one, the characteristics (e.g., doping concentration) of any two source regions 1122 can be the same or different, and this depends on the demand for implementation; similarly, the characteristics (e.g., lengths or doping concentration) of any two first channel regions 1124 can be the same or different, which depends on the demand for implementation.

In regard to the embodiments of FIGS. 1 and 2, the gate structure 114 of each gate-end structure 110 includes a conducting part 1142 and a nonconducting part 1144. The sizes, shapes, materials, and so on of the conducting part 1142 and the nonconducting part 1144 are dependent on the demand for implementation and beyond the scope of the present disclosure. The conducting part 1142 is used for receiving a gate voltage (e.g., control signal), wherein the gate voltage controls the on/off of the FinFET 100. The nonconducting part 1144 (e.g., dielectric layer) is set between the conducting part 1142 and the first channel region 1124, and used for separating the conducting part 1142 from the first channel region 1124. The gate structure 114 of each gate-end structure 110 is formed on a surface of the first channel region 1124 of the gate-end structure 110; accordingly, if the M is greater than one, M gate structures 114 are formed on the surfaces of M first channel regions 1124 respectively.

In regard to the embodiments of FIGS. 1 and 3, the second channel structure 122 of each drain-end structure 120 includes a second channel region 1222 and a drain region 1224. The sizes, shapes, materials, doping concentration, and so on of the second channel region 1222 and the drain region 1224 are dependent on the demand for implementation and beyond the scope of the present disclosure. The N drain-end structure(s) 120 include(s) N second channel region(s) 1222 and N drain region(s) 1224. When the N is greater than one, the characteristics (e.g., lengths or doping concentration) of any two second channel regions 1222 can be the same or different, and this depends on the demand for implementation; similarly, the characteristics (e.g., doping concentration) of any two drain regions 1224 can be the same or different, which depends on the demand for implementation. It is noted that the second channel region 1222 of any of the N drain-end structure(s) 120 and the first channel region 1124 of any of the aforementioned M gate-end structure(s) 110 are discontinuous; in other words, the channel between the source and the drain of the FinFET 100 is a discontinuous channel.

In regard to the embodiments of FIGS. 1 and 3, the RESURF structure 124 of each drain-end structure 120 is formed on a surface of the second channel region 1222 of the drain-end structure 120 to optimize the trade-off between the on-state resistance and the breakdown voltage of the FinFET 100; accordingly, if the N is greater than one, N RESURF structures 124 are formed on the surfaces of N second channel regions 1222 respectively. The sizes, shapes, materials, and so on of the RESURF structure 124 are dependent on the demand for implementation and beyond the scope of the present disclosure. In an exemplary implementation, both the RESURF structure 124 and the gate structure 110 are used for receiving the aforementioned gate voltage, and thus the RESURF structure 124 is the same as or similar to the gate structure 110; however, the present invention is not limited to the above features. In an exemplary implementation, the RESURF structure 124 is a dielectric film, and thus the RESURF structure 124 is not used for receiving the gate voltage and is different from the gate structure 110; however, the present invention is not limited to the above features. It is noted that the RESURF structure 124 is not a must for the implementation of the present invention, and therefore the RESURF structure 124 can optionally be omitted.

In regard to the embodiments of FIGS. 1 and 4, the conducting structure 130 is coupled with the first channel region 1124 of a certain gate-end structure of the M gate-end structure(s) 110 and coupled with the second channel region 1222 of a certain drain-end structure of the N drain-end structure(s) 120. As shown in FIG. 4, the embodiment of the conducting structure 130 includes the first contact 132 and the second contact 134. The first contact 132 is used for coupling the first channel region 1124 of the certain gate-end structure with the conducting layer 410; the second contact 134 is used for coupling the second channel region 1222 of the certain drain-end structure with the conducting layer 410; and all of the M gate-end structure(s) 110 and the N drain-end structure(s) 120 are set outside the conducting layer 410.

Figure 5:
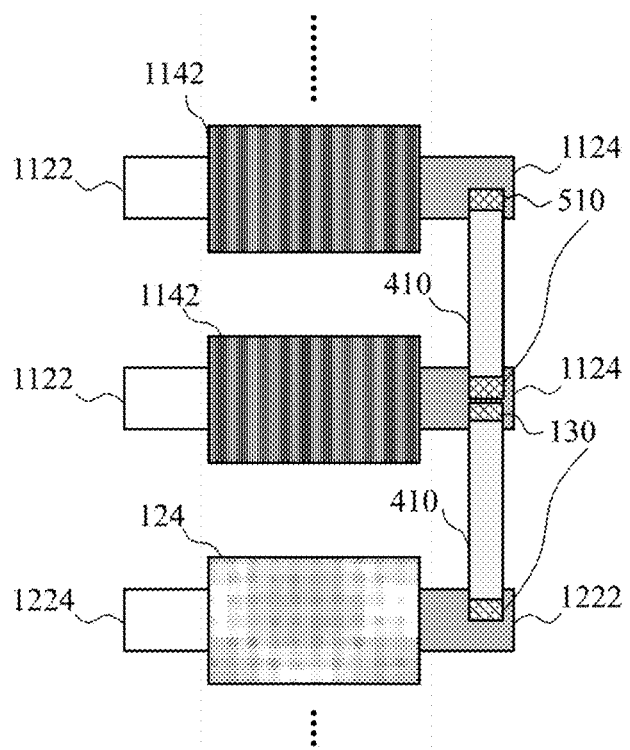
FIG. 5 shows a top view of FIG. 1 including multiple gate-end structures coupled together in parallel.

FIG. 5 shows a top view of the FinFET 100 including M gate-end structures 110 coupled together in parallel, wherein the M is greater than one. In regard to FIG. 5 in view of FIGS. 1-4, the M first channel regions 1124 of the M gate-end structures 110 are coupled together through (M−1) conducting structure(s) 510 so that the M gate-end structures 110 are coupled together in parallel and the on-state resistance at the gate side of the FinFET 100 is reduced. An embodiment of each conducting structure 510 is similar to the conducting structure 130 of FIG. 4 including two contacts 132 and 134, and this embodiment includes two contacts that are used for coupling the first channel regions 1124 of two gate-end structures 110 together through a conducting layer (e.g., conducting layer similar to the conducting layer 410 of FIG. 4). It is noted that according to the demand for implementation, the conducting part(s) 1142 of a part of the M gate-end structures can be used for receiving a control signal, a ground voltage, or a voltage (VCC) supplied to circuits while the conducting part(s) 1142 of the other part(s) of the M gate-end structures can be used for receiving another signal/voltage.

Figure 6:
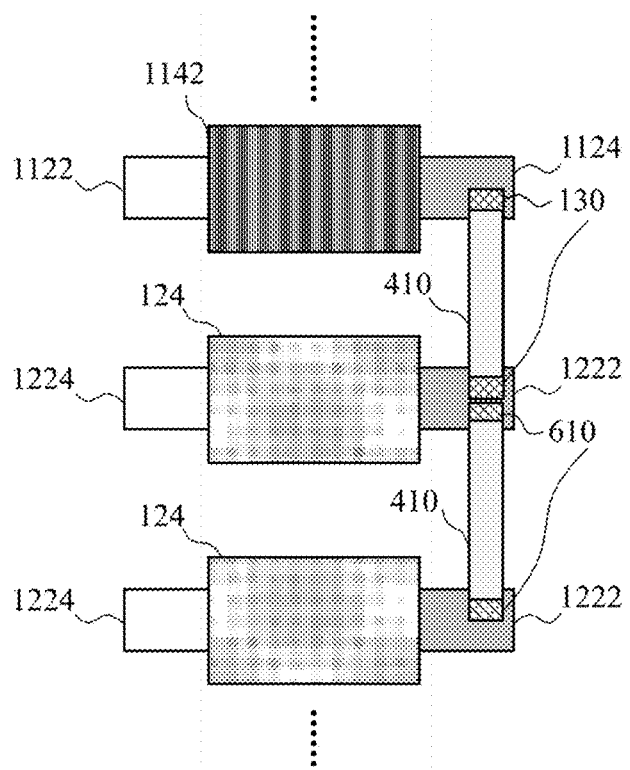
FIG. 6 shows a top view of FIG. 1 including multiple drain-end structures coupled together in parallel.

FIG. 6 shows a top view of the FinFET 100 including N drain-end structures 120 coupled together in parallel, wherein the N is greater than one. In regard to FIG. 6 in view of FIGS. 1-4, the N second channel regions 1222 of the N drain-end structures 120 are coupled together through (N−1) conducting structure(s) 610 so that the N drain-end structures 120 are coupled together in parallel and the on-state resistance at the drain side of the FinFET 100 is reduced. An embodiment of each conducting structure 610 is similar to the conducting structure 130 of FIG. 4 including two contacts 132 and 134, and this embodiment includes two contacts that are used for coupling the second channel regions 1222 of two drain-end structures 120 together through a conducting layer (e.g., conducting layer similar to the conducting layer 410 of FIG. 4). It is noted that according to the demand for implementation, the FinFET 100 of FIG. 6 may further include one or more additional drain-end structure(s) (e.g., the structure as shown in FIG. 3) which is/are coupled to the N drain-end structures 120 in series.

Figure 7:
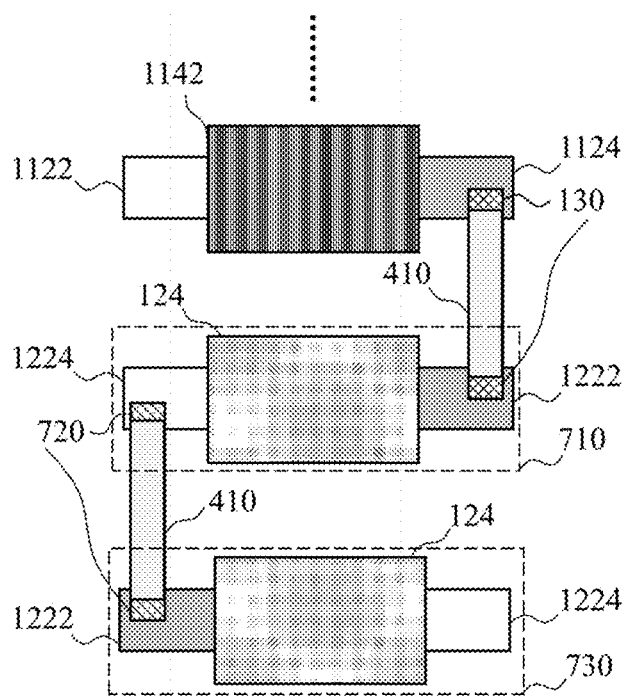
FIG. 7 shows a top view of FIG. 1 including multiple drain-end structures coupled together in series.

FIG. 7 shows a top view of the FinFET 100 including N drain-end structures 120 coupled together in series, wherein the N is greater than one. In regard to FIG. 7 in view of FIGS. 1-4, the N drain-end structures 120 includes a first drain-end structure 710 and a second drain-end structure 730, the drain region 1224 of the first drain-end structure 710 is coupled with the second channel region 1222 of the second drain-end structure 730 through a conducting structure 720 so that the first drain-end structure 710 and the second drain-end structure 730 are coupled together in series and the on-state resistance at the drain side of the FinFET 100 can be controlled in this manner; in other words, the breakdown voltage of the FinFET 100 contributed by the on-resistance can be controlled in this manner. An embodiment of each conducting structure 720 is similar to the conducting structure 130 of FIG. 4 including two contacts 132 and 134, and this embodiment includes two contacts that are used for coupling the first drain-end structure 710 with the second drain-end structure 730 through a conducting layer (e.g., conducting layer similar to the conducting layer 410 of FIG. 4).

In regard to FIGS. 5-6, when designing the FinFET 100, if an engineer chooses to make the on-state resistance of the FinFET 100 be mainly dependent on the on-resistance of the gate-end structures 110, the gate-end structures 110 can be coupled in parallel as shown in FIG. 5 to reduce the on-state resistance of the FinFET 100; meanwhile, the number of the drain-end structure(s) 120 can be one (i.e., N=1) to save circuit area. Similarly, if the engineer chooses to make the on-state resistance of the FinFET 100 be mainly dependent on the on-resistance of the drain-end structures 120, the drain-end structures 120 can be coupled in parallel as shown in FIG. 6 to reduce the on-state resistance of the FinFET 100; meanwhile, the number of the gate-end structure(s) 110 can be one (i.e., M=1) to save circuit area.

It is noted that people having ordinary skill in the art can selectively use some or all of the features of any embodiment in this specification or selectively use some or all of the features of multiple embodiments in this specification to implement the present invention as long as such implementation is practicable; in other words, the present invention can be carried out flexibly in accordance with the present disclosure.

To sum up, the FinFET of the present disclosure includes discontinuous channel regions and can achieve a low on-state resistance and a high breakdown voltage simultaneously.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. A fin field-effect transistor (FinFET), comprising:
   M gate-end structure(s), each of the M gate-end structure(s) including:
      a first channel structure including a source region and a first channel region, wherein the M gate-end structure(s) includes M first channel region(s); and
      a gate structure formed on a surface of the first channel region;
   N drain-end structure(s), each of the N drain-end structure(s) including:
      a second channel structure including a second channel region and a drain region, wherein the N drain-end structure(s) includes N second channel region(s), and any of the N second channel region(s) and any of the M first channel region(s) are discontinuous; and
      a reduced-surface-field (RESURF) structure formed on a surface of the second channel region; and
   a conducting structure used to couple the first channel region of a certain gate-end structure of the M gate-end structure(s) with the second channel region of a certain drain-end structure of the N drain-end structure(s) in series,
   wherein both the M and the N are positive integers, and the source region of the certain gate-end structure is coupled to the second channel region of the certain drain-end structure through the first channel region of the certain gate-end structure.

2. The FinFET of claim 1, wherein at least one of the M and the N is greater than one.

3. The FinFET of claim 2, wherein the M is greater than one, and the first channel regions of the M gate-end structures are coupled together through (M−1) first conducting structure(s) so that the M gate-end structures are coupled together in parallel.

4. The FinFET of claim 3, wherein the (M−1) first conducting structure(s) are coupled to the first channel regions of the M gate-end structures through a conducting layer, and the M gate-end structures are outside the conducting layer.

5. The FinFET of claim 3, wherein the N is greater than one, the N drain-end structures include a first drain-end structure and a second drain-end structure, and the drain region of the first drain-end structure is coupled to the second channel region of the second drain-end structure through a second conducting structure so that the first drain-end structure and the second drain-end structure are coupled together in series.

6. The FinFET of claim 5, wherein the second conducting structure are coupled to the drain region of the first drain-end structure and the second channel region of the second drain-end structure through a conducting layer, and the N drain-end structures are outside the conducting layer.

7. The FinFET of claim 2, wherein the N is greater than one, and the second channel regions of the N drain-end structures are coupled together through (N−1) second conducting structure(s) so that the N drain-end structures are coupled together in parallel.

8. The FinFET of claim 7, wherein the (N−1) second conducting structure(s) are coupled to the second channel regions of the N drain-end structures through a conducting layer, and the N drain-end structures are outside the conducting layer.

9. The FinFET of claim 2, wherein the N is greater than one, the N drain-end structures include a first drain-end structure and a second drain-end structure, and the drain region of the first drain-end structure is coupled to the second channel region of the second drain-end structure through a second conducting structure so that the first drain-end structure and the second drain-end structure are coupled together in series.

10. The FinFET of claim 9, wherein the second conducting structure is coupled to the drain region of the first drain-end structure and the second channel region of the second drain-end structure through a conducting layer, and the N drain-end structures are outside the conducting layer.

11. The FinFET of claim 1, wherein the RESURF structure and the gate structure(s) of the M gate-end structure(s) are used for receiving a gate voltage.

12. The FinFET of claim 11, wherein the RESURF structure is the same as the gate structure(s) of the M gate-end structure(s).

13. The FinFET of claim 1, wherein the RESURF structure is a dielectric film.

14. The FinFET of claim 13, wherein the dielectric film is different from the gate structure(s) of the M gate-end structure(s).

15. The FinFET of claim 1, wherein the conducting structure includes a first contact and a second contact, the first contact is used for coupling the first channel region of the certain gate-end structure with a conducting layer, and the second contact is used for coupling the second channel region of the certain drain-end structure with the conducting layer.

16. The FinFET of claim 1, wherein a length of each of the M gate-end structure(s) is a first length, a length of each of the N drain-end structure(s) is a second length, and the first length is equal to the second length.

17. A fin field-effect transistor (FinFET), comprising:
M gate-end structure(s), each of the M gate-end structure(s) including:
  a first channel structure including a source region and a first channel region, wherein the M gate-end structure(s) includes M first channel region(s); and
  a gate structure formed on a surface of the first channel region;
N drain-end structure(s), each of the N drain-end structure(s) including:
  a second channel structure including a second channel region and a drain region, wherein the N drain-end structure(s) includes N second channel region(s), and any of the N second channel region(s) and any of the M first channel region(s) are discontinuous; and
a conducting structure used to couple the first channel region of one of the M gate-end structure(s) with the second channel region of one of the N drain-end structure(s) in series,
wherein the source region of the one of the M gate-end structure(s) is coupled to the second channel region of the one of the N drain-end structure(s) through the first channel region of the one of the M gate-end structure(s), both the M and the N are positive integers, and at least one of the M and the N is greater than one.

18. The FinFET of claim 17, wherein the M is greater than one, and the first channel regions of the M gate-end structures are coupled together through (M−1) first conducting structure(s) so that the M gate-end structures are coupled together in parallel.

19. The FinFET of claim 17, the N is greater than one, and the second channel regions of the N drain-end structures are coupled together through (N−1) second conducting structure(s) so that the N drain-end structures are coupled together in parallel.

20. The FinFET of claim 17, the N is greater than one, the N drain-end structures includes a first drain-end structure and a second drain-end structure, and the drain region of the first drain-end structure is coupled to the second channel region of the second drain-end structure through a second conducting structure so that the first drain-end structure and the second drain-end structure are coupled together in series.

* * * * *